(12) United States Patent
Østergaard et al.

(10) Patent No.: US 6,683,898 B2
(45) Date of Patent: Jan. 27, 2004

(54) MODE CONTROL USING TRANSVERSAL BANDGAP STRUCTURE IN VCSELS

(75) Inventors: John Erland Østergaard, Bagsværd (DK); Dan Birkedal, Værløse (DK)

(73) Assignee: Alight Technologies A/S, Kongens Lyngby (DK)

( * ) Notice: Subject to any disclaimer, the term of this patent is extended or adjusted under 35 U.S.C. 154(b) by 0 days.

(21) Appl. No.: 10/092,502

(22) Filed: Mar. 8, 2002

(65) Prior Publication Data

US 2002/0163947 A1 Nov. 7, 2002

Related U.S. Application Data

(60) Provisional application No. 60/274,243, filed on Mar. 9, 2001.

(51) Int. Cl.[7] ............................................... H01S 5/00
(52) U.S. Cl. ........................................... 372/43; 372/45
(58) Field of Search ........................ 372/43, 45, 46, 372/49, 75, 96, 98, 90, 103, 54, 83; 385/15

(56) References Cited

U.S. PATENT DOCUMENTS

| | | | |
|---|---|---|---|
| 5,317,587 A | | 5/1994 | Ackley et al. |
| 5,412,680 A | | 5/1995 | Swirhun et al. |
| 5,712,865 A | * | 1/1998 | Chow et al. ............... 372/96 |
| 5,724,374 A | * | 3/1998 | Jewell ....................... 372/45 |
| 5,784,400 A | | 7/1998 | Joannopoulos et al. |
| 6,021,147 A | | 2/2000 | Jiang et al. |
| 6,058,127 A | * | 5/2000 | Joannopoulos et al. ..... 372/92 |
| 6,154,480 A | * | 11/2000 | Magnusson et al. ......... 372/96 |
| 6,160,834 A | * | 12/2000 | Scott ......................... 372/96 |
| 6,259,715 B1 | * | 7/2001 | Nakayama .................. 372/50 |
| 6,304,588 B1 | * | 10/2001 | Chua et al. ................. 372/46 |
| 6,366,597 B1 | * | 4/2002 | Yuen et al. ................. 372/96 |
| 6,434,180 B1 | * | 8/2002 | Cunningham ............... 372/50 |
| 6,507,594 B1 | * | 1/2003 | Furukawa et al. ........... 372/36 |
| 6,507,595 B1 | * | 1/2003 | Kapon et al. ............... 372/45 |

FOREIGN PATENT DOCUMENTS

| | | |
|---|---|---|
| JP | 10-284806 | 10/1998 |
| JP | 11-186657 | 7/1999 |

OTHER PUBLICATIONS

Painter O. et al. ("Lithographic Tuning of a Two–Dimensional Photonic Crystal Laser Array" IEEE Photonics Techonology Letters, IEEE Inc. New York, US, vol. 12, No. 9, Sep. 2000, pp. 1126–1128, XP000968620 ISSN: 1041–1135.)*

Erchark et al. ("Enhanced coupling to a vertical radiation using two–dimensional photonic crystal in a semiconductor light–emitting device", Applied Physics Lets, vol. 78, No. 5, Jan. 29, 2001, pp. 563–565).*

(List continued on next page.)

*Primary Examiner*—Paul Ip
*Assistant Examiner*—Tuan Nguyen
(74) *Attorney, Agent, or Firm*—Birch, Stewart, Kolasch & Birch, LLP

(57) ABSTRACT

A vertical cavity surface emitting laser (VCSEL) having a photonic band gap (PBG) region formed within or adjacent to a first and/or a second mirror, or within a spacer layer positioned between a gain region and at least one of the mirrors. The PBG region has a predetermined periodicity which substantially prevents the generated light from propagating the region, and defines a light aperture without the periodicity so as to allow the generated light to propagate through the aperture. The PBG region does not extend through the gain region, thereby allowing the full gain region to be used. Controls the efficiency of laser action by suppressing or preventing laser action in certain modes without losses, rather the modes are made forbidden. Energy from the forbidden modes is eventually coupled back to the allowed mode(s). Provides a separation of the confinement of the gain region and the mode control without introducing energy losses.

30 Claims, 11 Drawing Sheets

OTHER PUBLICATIONS

Hirayama et al., "Novel spontaneous emission control using 3–dimensional photonic bandgap crystal cavity," Material Science and Engineering, vol. B51, 1998, pp. 99–102.*

Pier et al., Photon localization in lattices of coupled vertical–cavity surface–emitting lasers with dimensionalities between one and two, Optics Letters, vol. 22, No. 8, Apr. 15, 1997, pp. 548–550.*

"Two–Dimensional Photonic Band–Gap Defect Mode Laser" by. O. Painter et al., Science, vol. 284, Jun. 11, 1999.

Erchak et al., "Enhanced coupling to a vertical radiation using a two–dimensional photonic crystal in a semiconductor light–emitting device," Applied Physics Letters, vol. 78, No. 5, Jan. 29, 2001, pp. 563–565.

Hirayama et al., "Novel spontaneous emission control using 3–dimensional photonic bandgap crystal cavity," MAterials Science and Engineering, vol. B51, 1998, pp. 99–102.

Patent Abstracts of Japan, 04144183, May 18, 1992.

Pier et al., "Photon localization in lattices of coupled vertical–cavity surface–emitting lasers with dimensionalities between one and two," Optics Letters, vol. 22, No. 8, Apr. 15, 1997, pp. 548–550.

Unold et al., Photonic Crystal Surface–Emitting Lasers: Tailoring Waveguiding for Single–Mode Emission. No date.

Zhou et al., "Electrically injected single–defect photonic bandgap surface–emitting laser at room temperature," Electronics Letters, vol. 36, No. 18, Aug. 31, 2000.

"Lithographic Tuning of a Two–Dimensional Photonic Crystal Laser Array", O. Painter et al., IEEE Photonic Technology Letters, vol. 12, No. 9, Sep. 2000, pp. 1126–1128.

* cited by examiner

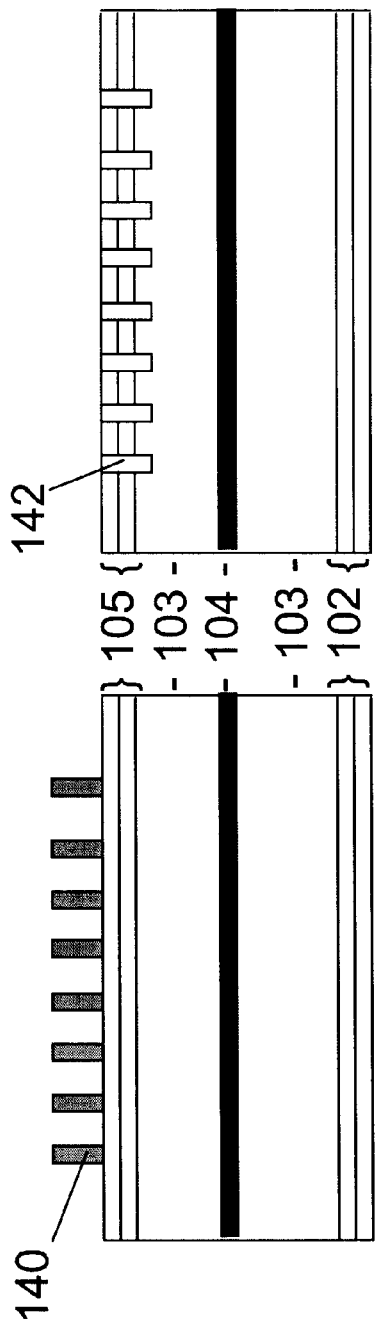
Fig. 8A
Fig. 8B
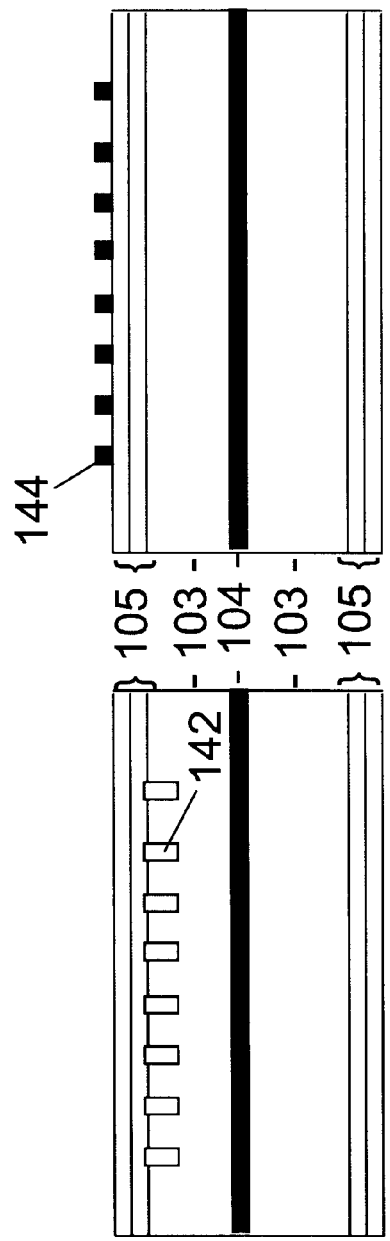
Fig. 8C
Fig. 8D

MODE CONTROL USING TRANSVERSAL BANDGAP STRUCTURE IN VCSELS

This application claims priority on provisional Application No. 60/274,243 filed on Mar. 9, 2001, the entire contents of which are hereby incorporated by reference.

FIELD OF THE INVENTION

The present invention relates to vertical cavity surface emitting lasers and more particularly to the control of transverse laser modes using a photonic band gap structure having a light aperture.

BACKGROUND OF THE INVENTION

The optical radiation emitted from lasers may have different spatial distributions. If a laser emits optical radiation that contains only the fundamental transverse mode, the radiation is a narrow laser beam with a Gaussian-distributed cross-section, most intense in the centre and less intense at the edges. In contrast, laser radiation having a higher transversal mode displays bright and dark spots across a cross-section of the radiation. The transverse electromagnetic modes are conventionally designated as $TEM_{00}$, $TEM_{01}$, $TEM_{10}$, $TEM_{11}$, etc. where $TEM_{00}$ is the fundamental transverse mode and the others are higher transverse modes.

Radiation with higher transverse modes is normally undesirable because it is difficult to couple such radiation into optical fibres and to focus it for free-space beam forming. In addition, higher transverse mode radiation travels at somewhat slower speed in an optical fibre than the fundamental transverse mode radiation, thereby creating mode dispersion, i.e., broadening of an optical pulse as it travels in an optical fibre.

Vertical Cavity Surface Emitting Lasers (VCSELs) are semiconductor lasers having an optical cavity formed by mirrors which are parallel to a substrate on which the laser is formed. Thus, the optical cavity of a VCSEL is perpendicular to the substrate; and optical radiation is emitted from the VCSEL in a direction normal to the substrate. VCSELs are typically layered structures where the cavity mirrors are formed as stacks of distributed Bragg reflectors (DBR) around an active semiconductor layer.

VCSELs have many advantages over conventional edge emitting semiconductor lasers. For example, VCSELs can be made extremely small; VCSELs can easily be made into arrays that contain a large number of VCSELs; VCSELs can be tested at an early stage during manufacturing (on-wafer testing) which is an important parameter in the cheap production of VCSELs; VCSELs can be subject to very fast modulations compared to lasers in the same price-range.

The DBRs are either grown epitaxially with the rest of the structure, or deposited at a later stage. In the first case the mirrors are made from semiconducting material, whereas in the latter case the mirrors are made from dielectrics. The gain medium of the VCSEL is formed by providing an electrical current to the active layer. Typically, a small, micrometer sized current aperture is fabricated near the active layer to define a transverse extent of the gain region. When the mirrors are made from semiconducting material, the current injection to the active layer can happen through the mirrors by properly doping the semiconducting material. Dielectric mirrors cannot conduct current, and a lateral charge injection to the active layer is provided by electrical contacts.

The current aperture controls both the transverse extent of the gain region and the transverse mode lasing of the laser. A critical VCSEL design issue is related to the current aperture which laterally concentrates the injected carriers to provide large enough gain to overcome cavity losses and achieve lasing. The transverse dimension of the current aperture also determines the amount of power which can efficiently be coupled to lasing modes and thereby ultimately determines the obtainable output power of the laser. It is often necessary to have a current aperture which is large in relation to the transverse dimensions of the transverse modes in order to obtain a reasonable power output. As a result, the VCSEL lases in several transversal modes already at medium powers of a few mW. A typical circular shaped VCSEL with a current aperture diameter greater than 10 $\mu$m, emits $TEM_{00}$ mode radiation only at low currents. At higher currents, lasing in the higher transverse modes sets in.

U.S. Pat. No. 5,317,587 relates to a method of manufacturing VCSELs. The method uses dielectric current confinement in addition to transparent metal contacts and a mesa-shaped area to separately control the injected current distribution and the optical mode.

Also, VCSELs typically emit radiation having uncontrolled directions of polarisation. In many applications (e.g. magneto-optical disks, optical communication applications etc.), lasers having predetermined directions of polarisation are highly desirable. Further, adjacent VCSELs in a VCSEL array have a tendency to couple with each other in an uncontrolled manner. In some instances, this results in unwanted beam cross sections.

U.S. Pat. No. 5,412,680 provides a method for controlling the polarisation and the lasing mode of VCSELs by using strained semiconductor layers with a preferred direction of conductivity.

JP 10 284 806 and JP 11 186 657 provide a VCSEL with a two-dimensional photonic band gap (PBG) structure in a plane parallel with the cavity mirrors. The PBG structure restricts spontaneous emission from the gain region so as to decrease cavity losses.

The article *Enhanced coupling to vertical radiation using a two-dimensional photonic crystal in a semiconductor light-emitting diode* by Erchak et al. (Applied Physics Letters, 78, 563, 2001), describes the use of PBG structures in the surface of light emitting diodes to enhance the light extraction efficiency up to six times.

W. D. Zhou et al., Electronics Letters, Vol. 36, no. 28, 1541 (2000) describes the experimental work with a surface emitting optical device. The device is made from the GaAs/AlGaAs system and consist of a bottom distributed Bragg mirror of n-type, an undoped lambda cavity with two embedded InGaAs quantum wells for optical gain, and a top p-type layer. The structure has been structured with a regular array of holes penetrating the top p-type layer, the lambda cavity with the embedded gain material, and a part of the bottom Bragg-mirror. The etching depth is in total 0.8 microns. The regular structure is intended to have a photonic band gap effect and have a defect defined by leaving out one of the holes. The structure is lasing on a mode defined by the defect by observing light emission concentrated in a region including the defect. The maximum output power from the device is reported to be 14.4 $\mu$W.

In the described structure it is necessary to etch through the top and the gain region to get sufficient overlap with the field. The requirement of etching through the gain material restricts the total area of gain material within the defect area and reduces the resulting output power. The authors achieve 14.4 $\mu$W. At least two orders of magnitude more power are needed to be useful in practice.

SUMMARY OF THE INVENTION

Separating the current confinement and the mode control can result in VCSEL with considerably increased power output and better beam properties, e.g. in the form of single mode operation. In the prior art, such separation has been performed by simply introducing large losses for higher order modes e.g. by providing a lower reflectivity for higher order modes as compared to the fundamental mode. However, since energy can be coupled between modes, this results in large energy losses leading to a low efficiency and low power output. The present invention provides a separation of the confinement of the gain region and the mode control, without the disadvantages of the prior art.

In a first aspect, the present invention provides a VCSEL comprising:

a semiconductor material layer having a gain region adapted to generate light and to emit the generated light, first and second at least substantially parallel mirrors forming a laser cavity comprising the gain region and at least one spacer layer being positioned between the gain region and the first and/or the second mirror, at least one of the mirrors being partially transparent to the generated light so as to allow the light generated in the gain region to be emitted through said at least one mirror, the laser cavity and the gain region supporting at least one transverse electromagnetic mode for the generated light, and a photonic band gap region formed within or adjacent to the first and/or the second mirror, or within one of the at least one spacer layer(s), the photonic band gap region being positioned at least substantially parallel to the first and second mirror, the photonic band gap region having a predetermined periodicity which substantially prevents the generated light from propagating in said region, the photonic band gap region further defining a light aperture without the predetermined periodicity, so as to allow the generated light to propagate through said light aperture, the dimensions of the photonic band gap region and the light aperture being adapted to at least partly control an efficiency of laser action in each transverse electromagnetic mode, the dimension of the photonic band gap region in a direction being substantially normal to the first and second mirror being significantly smaller than the overall dimension of the vertical cavity surface emitting laser in said direction.

Thus, according to the present invention, the current confinement and the mode control is separated by providing, in or adjacent to a VCSEL cavity, a PBG region having a light aperture controlling the lasing modes. It is an advantage of the present invention, that it controls the lasing in modes by suppressing or preventing laser action by providing regions into which transverse components of the radiation can not propagate. Thereby, there will be little or no laser action in modes extending substantially into these regions. Hence, the method does not suppress lasing by introducing severe losses for those modes, rather, the modes are made forbidden. Taking another point of view, the higher order modes are restricted in size whereby they obtain a much lower modal gain than the fundamental modes—hence, lasing in the fundamental modes is promoted compared to lasing in higher order modes. Radiation incident normally to the PBG region, within the PBG region or within the light aperture, will not be affected by the PBG region and hence will be reflected by the mirror as usual, without experiencing losses due to the PBG region.

Thus, the present invention provides sufficient power to allow the VCSEL to be of practical use because the full gain region is used. This is a great advantage of the present invention. In the structure described in W. D. Zhou et al., Electronics Letters, Vol. 36, no. 28, 1541 (2000), on the other hand, only a small part of the gain region is used, resulting in a reduced power to the extend that the output may not be used for practical purposes. A spacer layer may be positioned between the gain region and only one of the mirrors. Alternatively, one spacer layer may be positioned between the gain region and the first mirror, while another spacer layer is positioned between the gain region and the second mirror. Alternatively, two or more spacer layers (e.g. manufactured from various materials) may be positioned between the gain region and the first and/or the second mirror, or one or more of the spacer layers may be constituted by a number of layers, e.g. of various material.

By positioning the PBG region within or adjacent to the first and/or the second mirror, or within one of the spacer layer(s), it is ensured that the PBG region does not extend through the whole of the gain region. This is a great advantage since this ensures that the full gain region is available for providing the sufficient output power from the VCSEL.

Preferably, the PBG region is positioned in such a way that it does not intersect the gain region at all.

In the present application, the terms, transverse mode and mode refers to transverse electromagnetic modes conventionally designated as $TEM_{00}$, $TEM_{01}$, $TEM_{10}$, $TEM_{11}$, etc., unless otherwise stated.

Photonic band gap effects are well documented both experimentally and theoretically. They rely on a periodic modulation of an optical constant such as the material permittivity in one, two, or three dimensions by forming a one, two, or three-dimensional periodic microstructuring in the material. The microstructuring can either result in a modulated refractive index (etching of air holes) as well as in a modulation of the absorption coefficient by deposition of e.g. circular or differently shaped metal areas.

According to a second aspect, the present invention provides a polarised VCSEL according to the first aspect, but wherein the light aperture is elongated and has a dimension $\alpha$ along a first axis and a dimension $\beta<\alpha$ along a second axis perpendicular to the first axis, and wherein the dimensions of the photonic band gap region and the elongated light aperture are adapted to at least partly control an efficiency of laser action in each transverse electromagnetic mode and to suppress or prevent laser action in transverse electric modes which are not polarised at least substantially parallel to the first axis.

According to a third aspect, the present invention provides a VCSEL according to the first aspect, but wherein the scattering centres are elongated along a first axis, and wherein the dimensions of the photonic band gap region and the light aperture are adapted to at least partly control an efficiency of laser action in each transverse electromagnetic mode, and wherein the elongation of the scattering centres is adapted to suppress or prevent laser action in transverse electric modes which are not polarised at least substantially parallel to the first axis.

The elongation of the scattering centres breaks a symmetry of the PBG region whereby an electric field polarised parallel with the first axis experiences a smaller scattering cross section from the scattering centres, than an electric field polarised perpendicular to the first axis. By experiencing a smaller scattering cross section from the scattering centres, lasing in a mode which is polarised parallel with the first axis will be suppressed less than lasing in a mode which is polarised perpendicular to the first axis.

Preferably, the elongated light aperture in a VCSEL according to the second aspect of the present invention has a two fold symmetry.

Preferably, the light aperture in a VCSEL according to the first or third aspect of the present invention has a three- or more-fold symmetry. Typically, the light aperture will be shaped as a regular polygon.

In the following, some preferred features of a VCSEL laser according to the first, second and/or third aspect of the present invention are described.

The laser cavity may support a plurality of transverse modes. In the present application, a transverse electromagnetic mode can be regarded as a distribution of wave-vectors k describing the propagation of the electromagnetic field. Any of the wave-vectors k may be projected onto a plane which is normal to the extension of the cavity, such as a plane parallel to the PBG region. The projection of k onto such as plane will be designated the transverse component $k_T$ of the wave-vector k, the term transverse referring to the extent of the cavity rather than to k.

The dimensions of the photonic band gap region and the light aperture preferably control the laser action for each transverse electromagnetic mode by controlling a ratio between transverse components $k_T$ lying within the light aperture and transverse components $k_T$ lying within the photonic band gap region. Thereby, the ratio between transverse components $k_T$ lying within the light aperture and transverse components $k_T$ lying within the PBG region determines a suppression or prevention of laser action in transverse electromagnetic modes so as to suppress or prevent laser action in modes having a low ratio in relation to modes having a high ratio. Preferably, the dimensions of the photonic band gap region and the light aperture are adapted to suppress or prevent laser action in higher order transverse electromagnetic modes in relation to laser action in a fundamental transverse electromagnetic mode of the cavity ($TEM_{00}$).

If the VCSEL is electrically driven, it may further comprise current supply means for supplying an electric current to a region of the semiconductor material for defining the gain region. Alternatively, if the VCSEL is optically pumped, it may comprise means for supplying optical pumping to a region defining the gain region. In both cases, the gain region may be characterised in that it, in a plane at least substantially parallel to the first and second mirror, has a substantial overlap with two or more transverse electromagnetic modes of the cavity.

Thus, the separation of the current confinement and the mode control renders possible a much larger gain region while having mode control, such as while having single mode operation. Since the mode control is provided by the PBG region and the light aperture, the gain region may energetically couple to several transverse modes without deterioration of the single mode operation. According to the present invention, the energy coupled to other modes is not lost since the PBG region does not absorb radiation as such, rather, the energy eventually couples back to the fundamental lasing mode.

Typically, the first and second parallel mirrors are distributed Bragg reflectors (DBRs), one of which forms an output coupler by allowing a fraction of impinging radiation to be transmitted. The mode control according to the present invention does not restrict the PBG to the output coupling mirror. The light aperture still serves as an aperture for the light since it constitutes an allowed region for the transverse components of the wave-vector of the modes.

In a fourth aspect, the present invention provides a phased array of VCSELs comprising:
a semiconductor material body having a gain region adapted to generate light and to emit the generated light,
first and second parallel mirrors forming a laser cavity comprising the gain region and at least one spacer layer being positioned between the gain region and the first and/or the second mirror, at least one of the mirrors being partially transparent to the generated light so as to allow the light generated in the gain region to be emitted through said at least one mirror, and
a photonic band gap region formed within or adjacent to the first and/or the second mirror, or within one of the at least one spacer layer(s), the photonic band gap region being at least substantially parallel to the first and second mirror, the photonic band gap region having a predetermined periodicity which substantially prevents the generated light from propagating in said region, the photonic band gap region further defining two or more separated light apertures positioned within a region defined by a projection of the gain region onto a plane being adjacent to or within the first or the second mirror, the two or more light apertures being regions without the predetermined periodicity forming two or more coupled laser resonators, the dimensions of the photonic band gap region and the two or more light apertures being adapted to at least partly control an efficiency of laser action in transverse electromagnetic modes in each laser resonator.

The dimension of the PBG region in a direction being substantially normal to the first and second mirror may be significantly smaller than the overall dimension of the phased array of vertical cavity surface emitting lasers in said direction, thereby ensuring that the PBG region does not extend through the whole of the cavity, in particular not through the entire gain region.

Preferably, the PBG region is positioned in such a way that it does not intersect the gain region at all.

The dimensions and positions of the light apertures may be adapted to focus the emitted light at a distance from the laser. The apertures may take various shapes determined so as to optimise the focus of the far field. The two or more light apertures may also be similar to the light apertures according to the first or third aspect of the present invention.

In a fifth aspect, the present invention provides a method of manufacturing a VCSEL with control of transverse electromagnetic mode, the method comprising the steps of:
providing a substrate,
forming a first parallel stack of distributed Bragg reflectors on the substrate,
forming an active layer and a spacer layer on the first parallel stack,
forming a second parallel stack of distributed Bragg reflectors on the active layer and the spacer layer,
forming a photonic band gap region within or adjacent to the first and/or the second parallel stack, or within the spacer layer, by forming a periodic modulation in the permittivity of one or more layers of the first and/or the second parallel stack, or the spacer layer, said photonic band gap region being formed so as to delimit a light aperture for controlling the transverse electromagnetic mode, said light aperture being formed by a region in the photonic band gap region without said periodic modulation of the permittivity.

Preferably, the PBG region is formed and positioned in such a way that it does not intersect the gain region.

Preferably, the periodic modulation of the permittivity is formed by forming a periodic lattice of holes in the first and/or the second parallel stack. Alternatively, the periodic modulation of the permittivity may be formed by depositing semiconductor material or metallic pads in a periodic lattice on the second stack.

Depending of the desired properties of the VCSEL, the light aperture may have a three or more fold symmetry, such as by being shaped as a regular polygon. Alternatively, in order to control the polarisation of the radiation, the light aperture may have a two fold symmetry and be elongated along a first axis defining a polarisation axis for the modes. In this case, the light aperture typically has the overall shape of a rectangle, a trapezium, or an ellipse.

Preferably, the method comprises the steps of:
  forming a current aperture for defining a gain region in the active layer, and
  forming charge injection means for providing current to the active layer.

Alternatively, the first parallel stack may be formed by materials which are at least substantially transparent for radiation of wavelength $\lambda_p$, the active layer in this case at least substantially absorbing radiation of wavelength $\lambda_p$, so as to allow for optical pumping of the VCSEL.

In a sixth aspect the present invention provides a method of manufacturing an array of coupled VCSELs with individual control of transverse electromagnetic modes, the method comprising the steps according to the fifth aspect, wherein the step of forming the photonic band gap region comprises the step of forming the photonic band gap region so as to delimit two or more light apertures.

The first, second, third, fourth, fifth, and sixth aspect may each be combined with any of the other aspects.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 8A–8D show cross sectional views of VCSEL lasers according to a preferred embodiment, illustrating different ways to form the PBG region.

DETAILED DESCRIPTION OF THE DRAWINGS

Figure 1A:
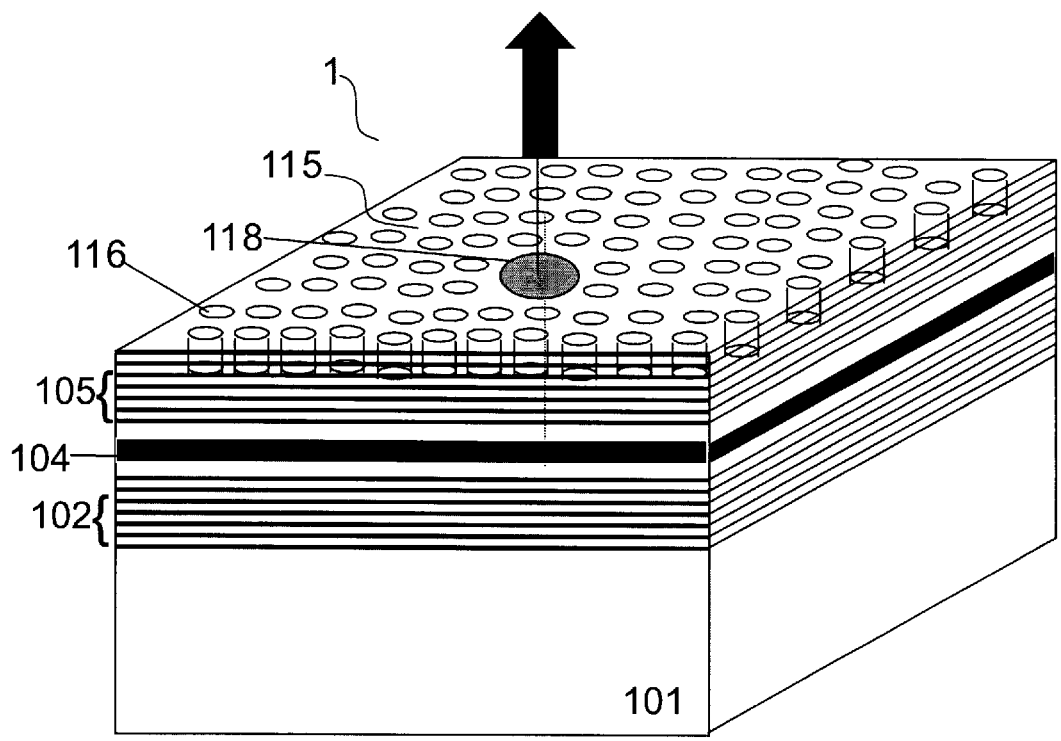
FIG. 1A shows a perspective view of a VCSEL comprising a PBG region and a light aperture according to a preferred embodiment of the present invention.

In a preferred embodiment of the present invention shown in FIG. 1A, a VCSEL laser 1 comprises a bottom mirror 102, an active layer 104, and a top mirror 105 on a substrate 101. In the top mirror, a PBG region 115 consisting of a two dimensional periodic lattice of scattering centres 116 is formed. The PBG region 115 delimits a light aperture 118 which is a region without the periodic lattice of scattering centres, such as a defect or a defect region in the periodic lattice.

Figure 1B:
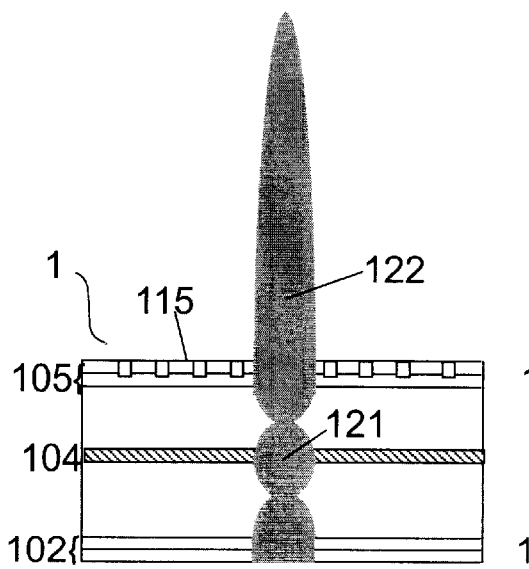
FIG. 1B shows a cross sectional view of the embodiment of FIG. 1A with the fundamental light mode outlined.

FIG. 1B is a side view of VCSEL laser 1 of FIG. 1A showing a lasing transverse mode 121 in the laser and the propagating mode 122 to which the transverse mode couples. It is an important feature that the lasing in the transverse mode 121 is possible only because the mode 121 exists within the light aperture 118 in the plane holding the PBG region. In a transverse mode having an extension substantially into the PBG region 115, laser action will be suppressed or prevented since the transverse components of the mode can not propagate in the PBG region 115. This allows the VCSEL according to the preferred embodiment to control the lasing in different transverse modes.

Figures 3A, 3B:
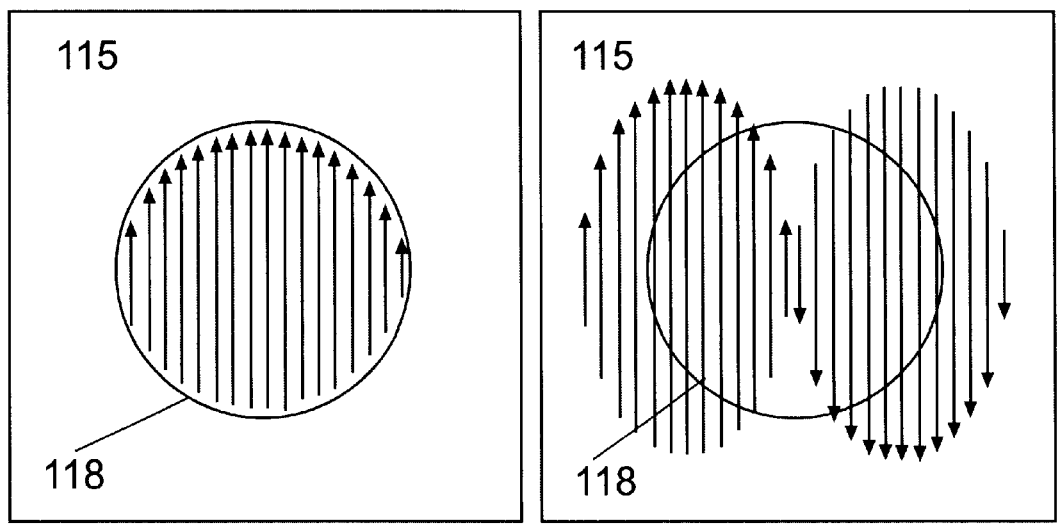
FIGS. 3A and 3B show an overlap between a light aperture and a transverse electromagnetic mode in VCSEL lasers according to the present invention.

The effect of the PBG region 115 can be illustrated by looking at the dimensions of different modes in the laser. The transverse mode can, in the plane holding the PBG region 115, be described as electric field vectors lying in the plane. If the mode is a fundamental $TEM_{00}$ mode having substantially the same size and symmetry or shape as the light aperture 118, the electric field vectors of the mode lies substantially within the light aperture 118. This is illustrated in FIG. 3A. If, on the other hand, the mode is a higher order mode, e.g. $TEM_{10}$, the electric field vectors of the mode will for a large part lie at least partly within the PBG region 115, and thereby the transverse components of the mode can not propagate in the plane and the mode will be suppressed. This is illustrated in FIG. 3B.

Figure 1C:
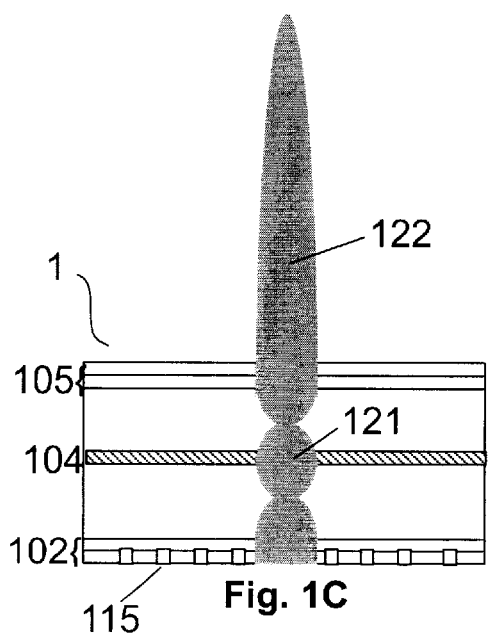
FIG. 1C shows a cross sectional view of another embodiment similar to the embodiment of FIG. 1A. with the fundamental light mode outlined.

FIG. 1C illustrates a different embodiment similar to the embodiment of FIGS. 1A and 1B. Here, the PBG region 115 and the light aperture 118 are positioned in relation to the nontransparent mirror 102 which dos not emit radiation. Since the PBG region 115 and the light aperture 118 suppress or prevent lasing in transverse modes in the laser cavity, the PBG region 115 need not be positioned at the out-coupling mirror 105.

Figure 2C:
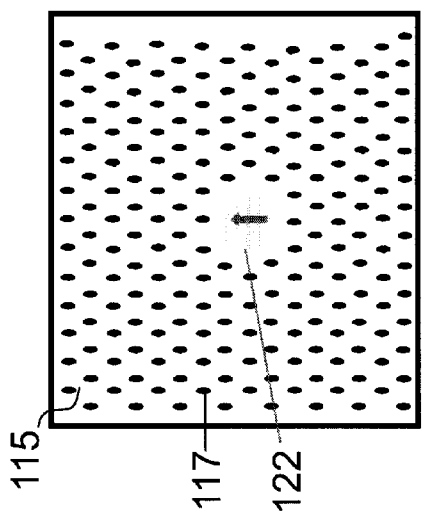
FIGS. 2A–2E show the PBG regions and the light apertures of a number of different embodiments of the present invention.
Figure 2B:
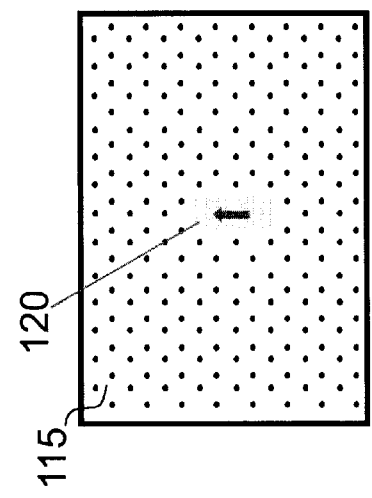
Figure 2A:
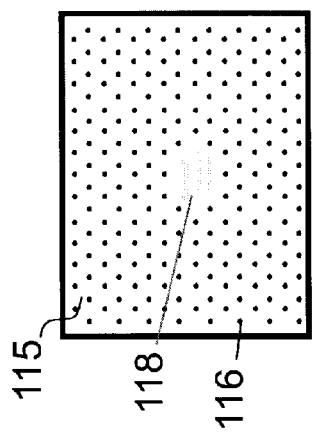

FIG. 2A shows a top view of the preferred embodiment of FIGS. 1A and 1B. Here, the periodic lattice forming PBG region 115 can be seen in more detail. The periodic lattice 115 is a triangular lattice, but other lattices may be used.

FIGS. 2B–2E show top views of a number of further preferred embodiments of the present invention. Here, the basic structure of the VCSEL is substantially equal to the embodiment described in relation to FIGS. 1A and 1B, only the properties of the PBG region 115 and/or the light aperture 118 are changed. In all the shown embodiments, the periodic lattice 115 is triangular, but other lattices may be used.

In FIG. 2B, the light aperture 120 is elongated, whereby the PBG region 115 affects the transverse modes differently in different directions. Transverse modes which, in the plane holding the PBG region 115, have an extent substantially smaller than the elongation length of the light aperture 120, may still be spatially cut-off since they extend into the PBG region 115 at the sides of the elongated light aperture 120. The PBG structuring forms a natural axis of polarisation of a transversal mode to be either along or perpendicular to the elongation. The two modes have different overlap with the gain material and experience different amount of modal gain. The mode polarised along the elongation has a larger modal gain and lasing on this polarisation mode is enhanced whereas lasing on the perpendicular polarised mode is suppressed.

In FIG. 2C, the scattering centres 117 are elongated along a common axis, whereby the PBG region 115 is asymmetric. In directions parallel to the elongation, the scattering centres 117, have a smaller cross section than in directions perpendicular to the elongation. This means that the electric fields of a transverse component of a mode will experience a smaller scattering cross sections in the lattice in directions parallel to the elongation than in directions perpendicular to the elongation. Thereby, the PBG effect becomes asymmetric, and modes polarised perpendicular to the elongation are suppressed in relation to modes polarised parallel to the elongation. Thus, the asymmetric PBG region 115 of FIG. 2C controls the polarisation of the emitted radiation. Further, the light aperture 122 controls the mode similar the embodiment described in relation to FIG. 2A, namely by suppressing laser action in higher order modes.

Figure 2E:
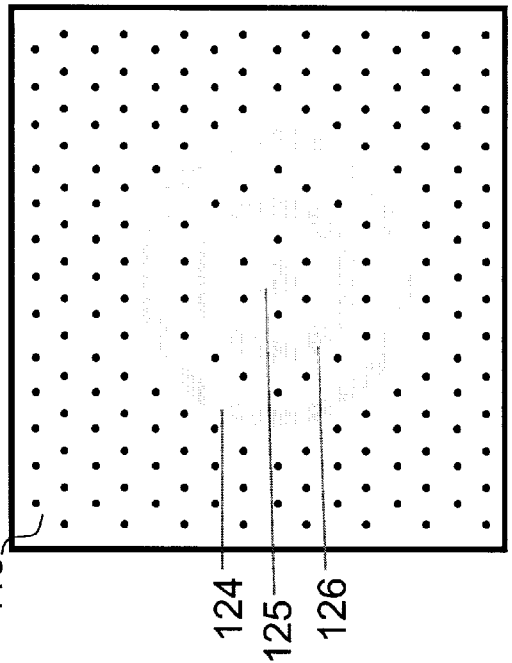
Figure 2D:
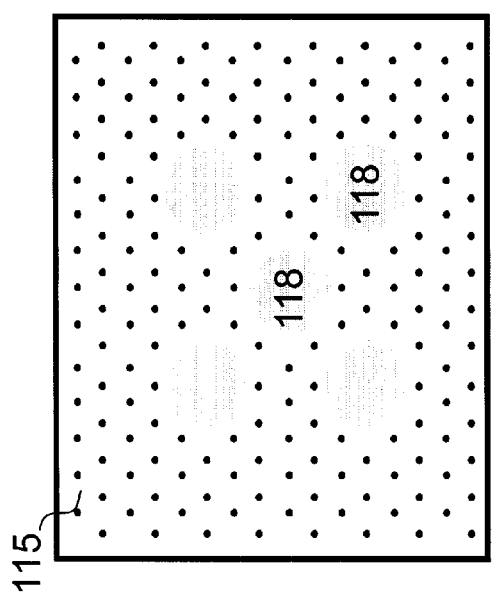

In FIGS. 2D and 2E, the PBG region 115 delimits a number of light apertures 118, 124, 125, 126. The VCSEL thereby contains a number of coupled laser resonators in well-defined relative positions. In FIG. 2D, the light apertures 118 are similar to the one in FIG. 2A, and supports five coupled laser resonators. In FIG. 2E, the apertures 124, 125, 126 are shaped as three concentric rings. Since the coupled laser resonators of the arrays are closely spaced and shares the same gain region, the resonators are coupled and the radiation emitted from the different resonators will be coherent or in-phase. Since the emitted radiation is coherent, the radiation from different resonators will interfere at some distance from the array. The shape and the relative positions of the resonators will determine the far field from the array. The shape of the disc and ring shaped light apertures 124, 125, 126 in FIG. 2D will give a focused field at some distance determined by the diameter of the apertures. Determining the diameters of the light apertures for forming a focus in the far field at a distance D from the array is most simply done by imagining that the desired focus in the centre of a sphere of concentric shells of thickness $\delta$ and radial distance $\in$. (Thus, the sphere is similar to an onion). The sphere is cut in a plane so that the distance from the centre to the plane, in a direction normal to the plane, is D. The cut surface will now form a series of concentric rings. The outermost ring will have a thickness close to $\delta$ and the thickness will increase towards the centre of the rings, which will form a circular disc. By providing light apertures having dimensions and shapes similar to the rings and disc of the cur surface, the far field will interfere to produce a focus at a distance D from the array. Typically, the light apertures can not have perfect circular shapes, and the resulting focus will typically not be a perfect focus.

Figure 4:
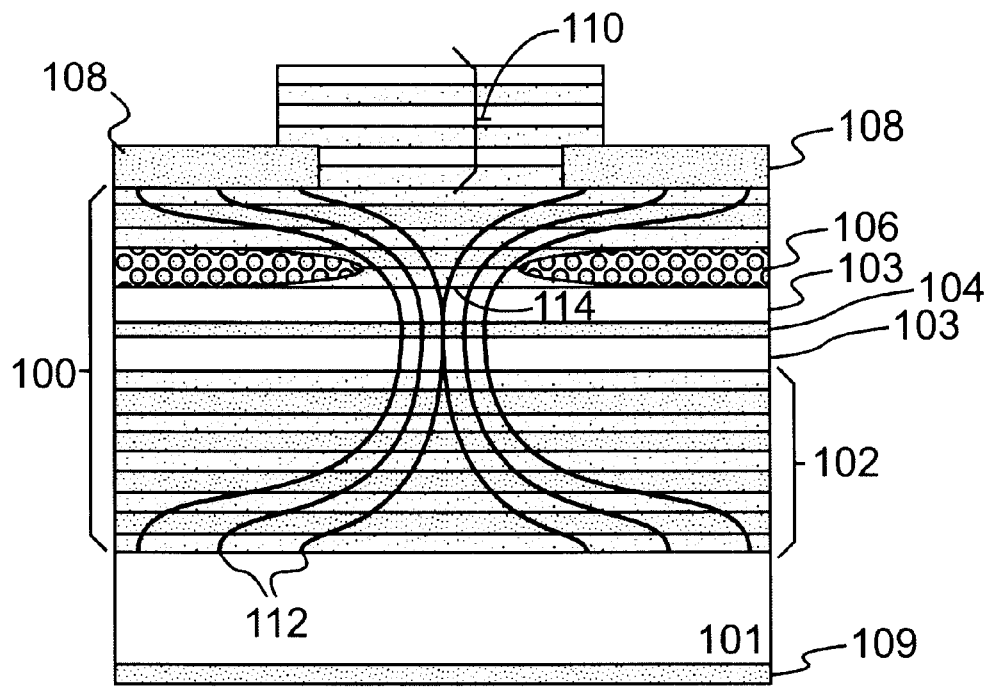
FIG. 4 shows a cross sectional view of a VCSEL with dielectric top mirror and a current aperture defined by ion implantation.
Figure 5:
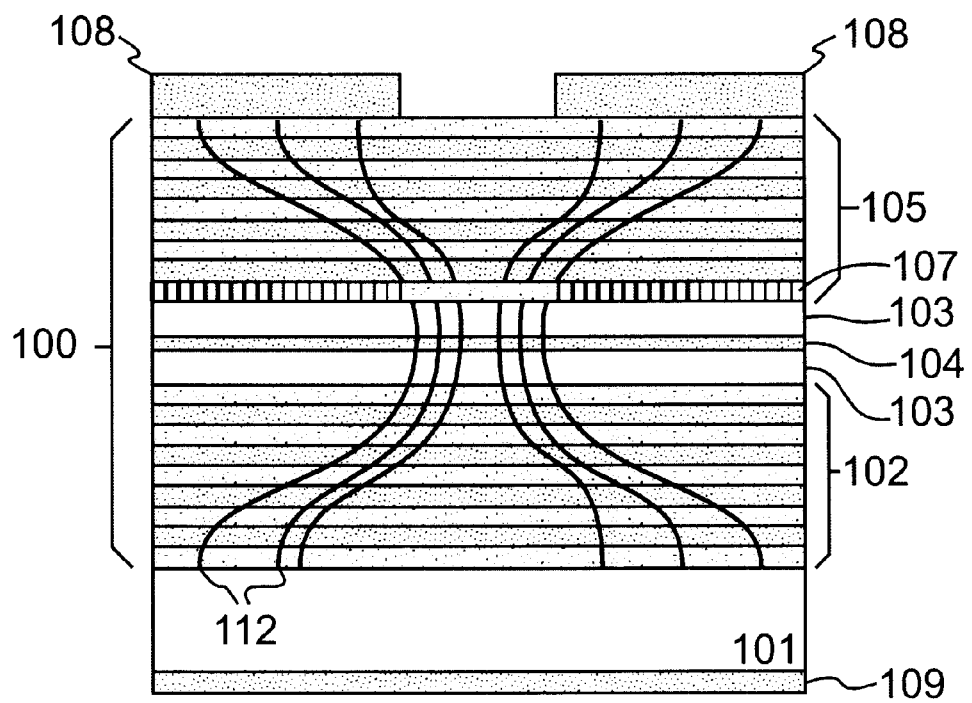
FIG. 5 shows a cross sectional view of a VCSEL with an epitaxially grown semiconductor top mirror and a current aperture defined by oxidation of one of the layers in the VCSEL.

As shown in FIGS. 4 and 5, the VCSEL comprises an epitaxially grown stack 100 on a substrate 101, The stack 100 comprises a bottom mirror 102, a first spacer layer 103, an active layer 104, a second spacer layer 103, a current aperture 114, and a top mirror 105 or 110. Additionally, the VCSEL also includes a top contact 108 and a substrate contact 109. The growth of stack 100 as well as deposition of various layers can be performed using standard methods known from the semiconductor industry.

The first mirror 102 is formed by growing alternating layers of semiconductor materials having differing refractive indices $n_r$, the layers having a thickness $\sim \lambda/n_r 4$. The layers can be made of GaAs as the high refractive index layer and GaAlAs or AlAs as the low refractive index layer. An active layer 104 is sandwiched between spacer layers 103 on the first DBR-mirror 102. The active layer 104 is typically formed by a number of layers forming a quantum well structure, e.g. InGaAs quantum well layers separated by GaAs barrier layers or GaAs quantum well layers separated by AlGaAs barrier layers.

In FIG. 4, the current aperture 114 is defined by ion implantation regions 106 where the semiconductor material is made semi-insulating in a thin sheet near the active layer. A small area is masked off to leave a conducting aperture 114 unaffected by the implantation.

Alternatively, as shown in FIG. 5, the current aperture 114 can be defined by selectively oxidising one of the layers in the VCSEL structure to form an oxidised region 107 defining the current aperture 114. First a mesa structure is etched to expose the sidewalls and then the selective oxidation is performed.

The top mirror 105 in FIG. 5 is grown epitaxially in the same process step as the rest of the stack 100 using semiconductor materials having differing refractive indices, the layers having a thickness $\sim \lambda/n_r 4$. By properly doping the layers to produce n- or p-type semiconducting material, current injections can take place from contact 108 through the mirror 105.

Alternatively, as shown in FIG. 4, the top mirror 110 can be deposited at a later stage using dielectric materials having differing refractive indices, the layers having a thickness $\sim \lambda/n_r 4$. Dielectric mirrors cannot conduct current, and charge injection to the active layers is provided by lateral injection from electrodes 108 formed around the top mirror 110 on the upper surface of the VCSEL.

The electrical contacts 108 and 109 to the VCSEL can be formed by standard photolithographic methods known from the semiconductor industry, such as metal deposition and lift-off techniques. The individual lasers on a wafer can be electrically isolated from each other by etching down through the epitaxially grown layers to the common n-type substrate.

A critical VCSEL design issue is related to laterally concentrate the injected carriers to achieve large enough gain to overcome cavity losses and achieve lasing. With better concentration of carriers lasing is achieved at a lower current injection and the lasing threshold is then reduced. Usually, the current aperture 114 is made near the active layer to achieve the concentration of injected carriers.

In prior art VCSELs, the current aperture also controls the predominant mode operation of the VCSEL. By making the current aperture small, single, fundamental mode operation can be obtained up to some power threshold where lasing in higher order modes sets in. However, if the current aperture is made small, only a limited power can be fed to the gain region. If the current aperture is enlarged, lasing in higher order modes will set in at lower threshold currents, or all the time. Thus, the dimension of the current aperture in a VCSEL is a fine balance between single mode and high power operation. VCSELs may also be optically pumped. In this case, the spatial overlap between the active layer and the pumping beam defines the gain region, and is thereby equivalent to the current aperture. The same considerations concerning the size of the overlap apply.

According to the present invention, the current confinement and the mode control are separated. The current confinement is provided by a current aperture as in the prior art (or equivalently by the focus of the pumping beam), whereas the mode control is provided by the PBG region and the light aperture. FIGS. 6 and 7 show semi-transparent top views illustrating the relative dimensions of the current aperture 114 and the light aperture 118.

Figure 6A:
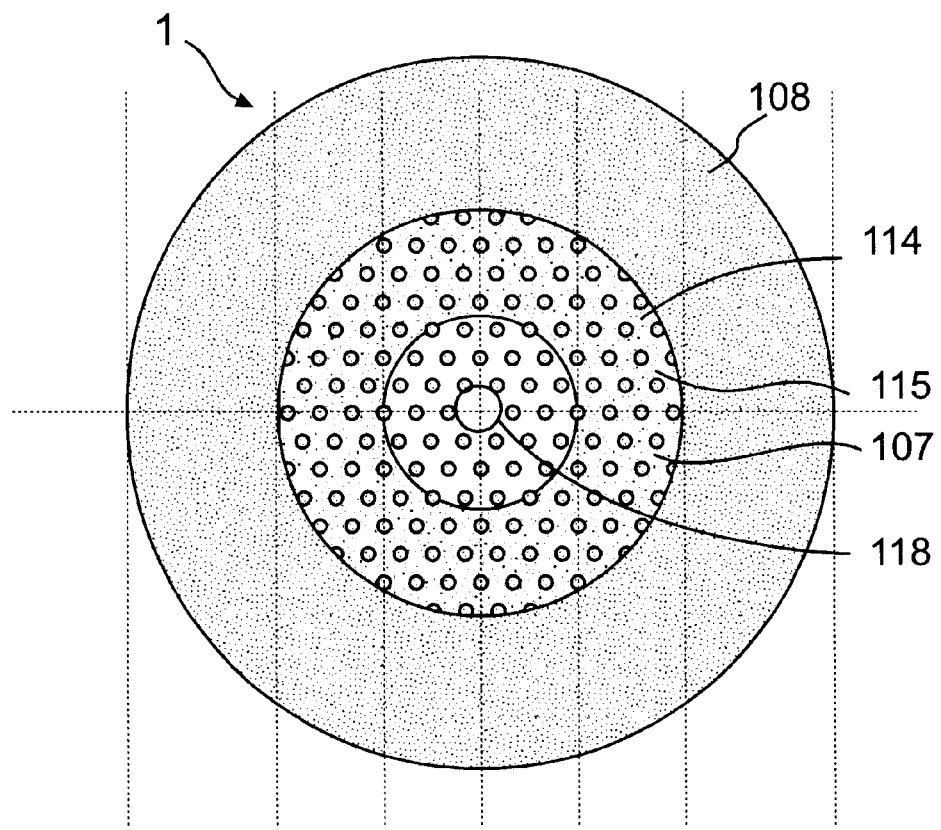
FIGS. 6A and 6B are a semitransparent top view and a cross-sectional view of a VCSEL according to a preferred embodiment of the present invention with contacts, PBG structure, light aperture and current aperture visible.
Figure 7A:
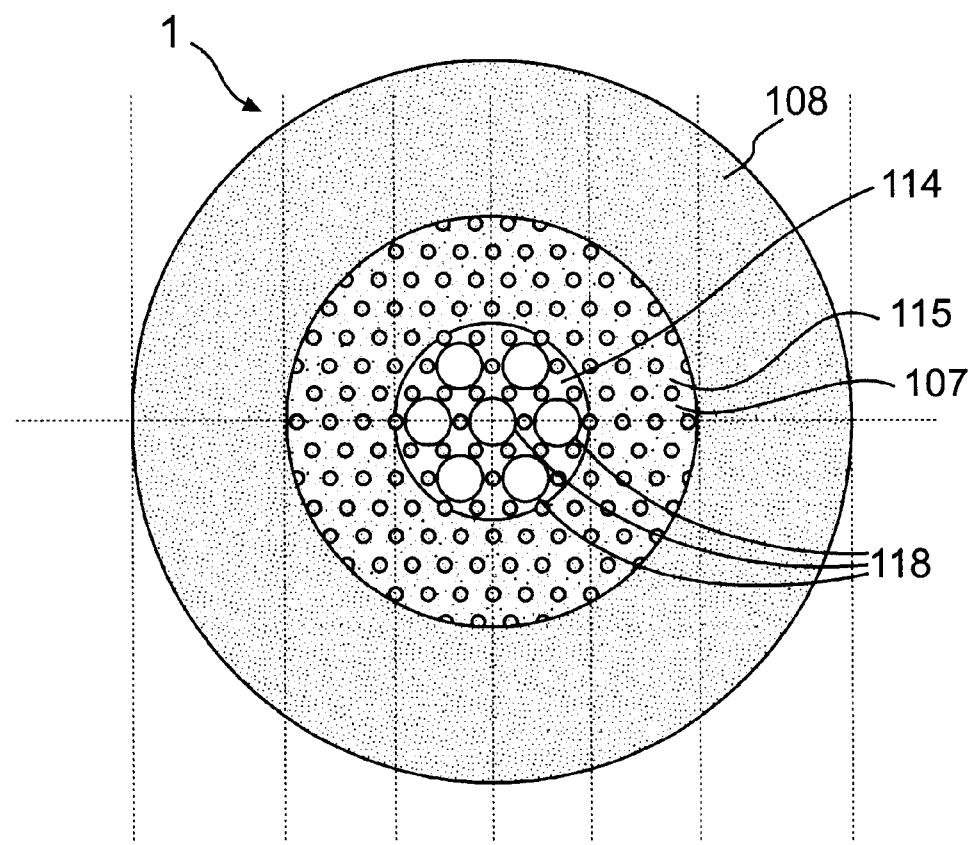
FIGS. 7A and 7B are a semitransparent top view and a cross-sectional view of a phased array of VCSELs according to a preferred embodiment of the present invention with contacts, PBG structure, light apertures and current aperture visible.
Figure 7B:
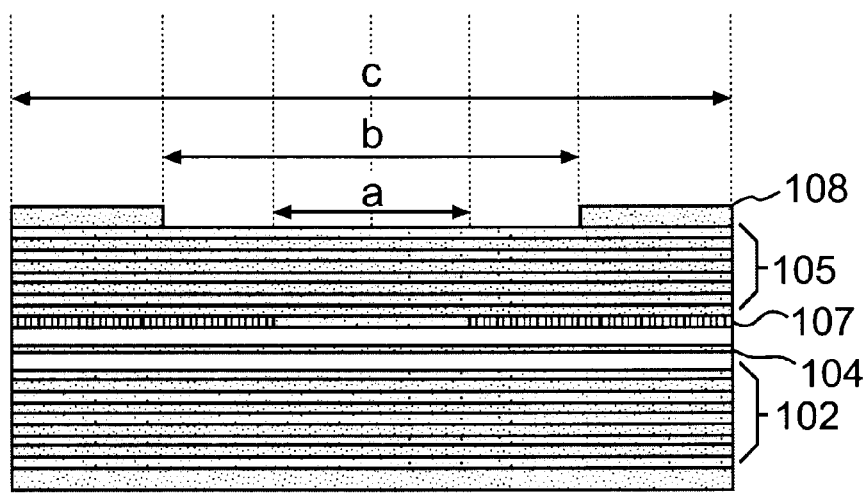

FIG. 6A illustrates typical relative dimensions of the light aperture 118, the current aperture 114, the PBG region 115 and the VCSEL 1. FIG. 7A illustrates similar dimensions, together with the dimensions of an array of light apertures 118.

Typical dimensions for VCSEL lasers according to the present invention are:

Diameter of light aperture 118: 0.2 μm–100 μm, such as 1 μm–100 μm, such as 5 μm–50 μm Diameter of array of light apertures: 10 μm–200 μm, such as 10 μm–100 μm, such as 20 μm–50 μm Diameter of current aperture: a=2 μm–200 μm, such as 3 μm–200 μm, such as 10 μm–100 μm Diameter of PBG region: b=2 μm–200 μm, such as 10 μm–200 μm, such as 30 μm–100 μm Diameter of VCSEL: c=10 μm–1000 μm, such as 30 μm–500 μm, such as 50 μm–150 μm From FIG. 7A, it can be seen that all the light apertures 118 in an array are preferably positioned so that they lie within the current aperture/gain region when projected perpendicularly onto the active layer 104.

The PBG microstructuring can be formed in a number of different ways and at a number of different positions as will be described in relation to FIGS. 8A–8D. The microstructuring is a two dimensional periodic variation of the permittivity of the material in a plane, and can either result from a modulated refractive index of the material, e.g. by etching of holes (filled with air or another material of different permittivity) or by formation of rods on a material surface, as well as from a modulation of the absorption coefficient of the material, e.g. by deposition of metal pads on a material surface.

FIG. 8A shows a side view of a VCSEL having a PBG microstructuring in the form of semiconducting rods 140 formed on the top mirror. The rods 140 are typically formed by:

I. providing a semiconductor material layer either by deposition or epitaxial growth together with the formation of the existing stack, II. defining the rods by a photolithographic step, and III. forming followed by reactive ion etching.

FIGS. 8B and 8C show a side view of a VCSEL having a PBG microstructuring in the form of holes 142, etched either in or below the top mirror. The etching of holes 142, or rods depending on their depth, can be carried out by reactive ion etching. The modulation lattice can be defined by electron beam lithography or UV lithography. The depth of the holes are preferably a few 100 nm, but can be varied as long as they serve their purpose, namely to control the light mode. The holes may be filled with a material of different refraction index or left empty (air filled).

FIG. 8D shows a VCSEL having a PBG microstructuring in the form of metallic pads 144. Deposition of metallic pads 144 in a lattice can be formed by standard photolithographic methods known from the semiconductor industry, such as metal deposition and lift-off techniques.

By providing the microstructuring in the top mirror defining the lasing mode, the PBG area prevents the (out-of-the PBG plane) propagating light having non-zero transverse components from penetrating into the PBG region of the PBG-plane, with the light aperture defining the mode as a result. Thus, the position of the PBG-plane in the mirror can be varied. To achieve the strongest effect, the PBG-plane should be formed at a plane in the mirror where the modes to be suppressed or prevented has their highest intensities (field strengths) or largest transverse components.

Figure 9:
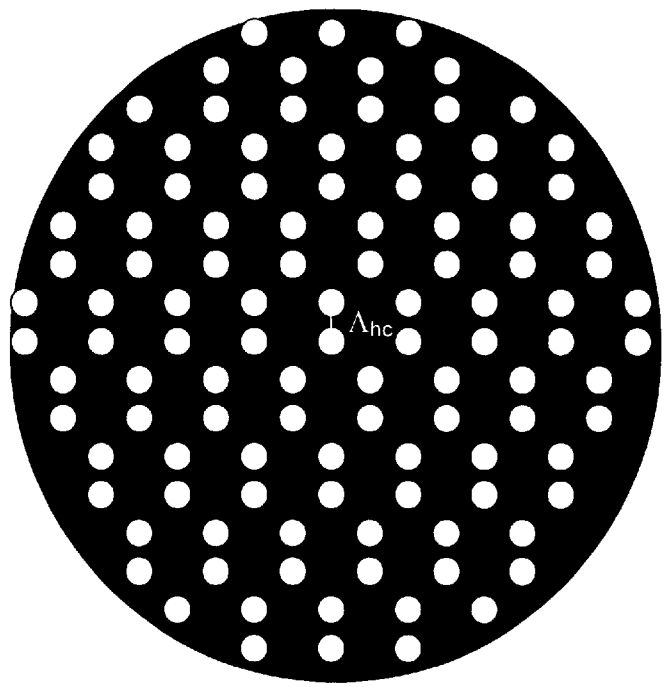
FIGS. 9 and 10 show a honeycomb and a triangular periodical lattice, respectively.
Figure 10:
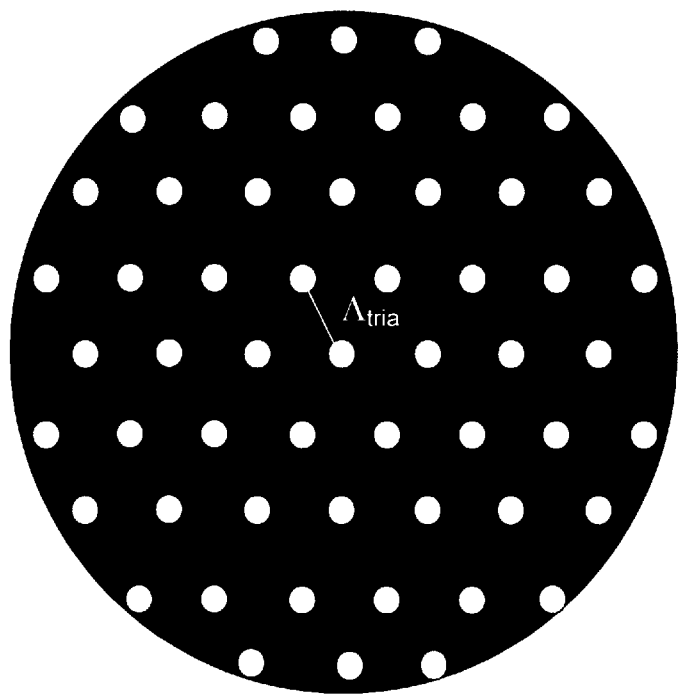

As mentioned previously, the PBG microstructuring can be made according to a number of different periodical lattices. FIG. 9 shows a honeycomb lattice having a distance $\Lambda_{hC}$ between the scattering centres. FIG. 10 shows a triangular lattice having a distance $\Lambda_{tria}$ between the scattering centres. Other lattices such as hexagonal, square, rectangular, and rhombic may also be used.

Figure 11:
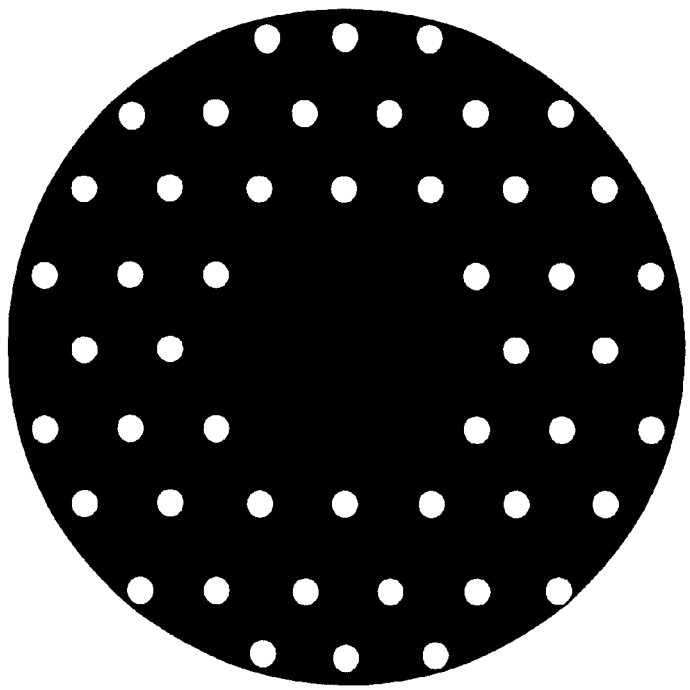
FIGS. 11–14 show detailed illustrations of the PBG regions and the light apertures of the embodiments of FIGS. 2A–2D, and FIGS. 15A and 15B are a semitransparent top view and a cross-sectional view of a VCSEL according to another embodiment of the present invention, wherein the PBG structure has a spherical symmetry.

FIG. 11 shows details of a triangular PBG-structure of the preferred embodiment described in relation to FIGS. 1A, 1B, 2A, and 4. Here, the light aperture 118 is formed my introducing a defect region in the lattice by removal of seven scattering centres lying adjacently in a "circular" region. The light aperture 118 is adapted to provide lasing in only the fundamental mode, $TEM_{00}$. Since the $TEM_{00}$ (ideally) has a circular symmetry, the light aperture preferably has a circular symmetry. However, a perfect circular symmetry can never be obtained in a periodical lattice, and therefore a high degree of symmetry is preferred. The light aperture shown in FIG. 11 has a hexagonal symmetry, giving six symmetry axis at angles 0°, 30°, 60°, 90°, 120°, and 150°. This is called a six-fold symmetry. If only one scattering centre was removed, as is the case in FIG. 4, the light aperture 118 would still have six fold symmetry. Light apertures adapted to provide lasing in only the fundamental mode preferably have three or more fold symmetries.

Figure 12:
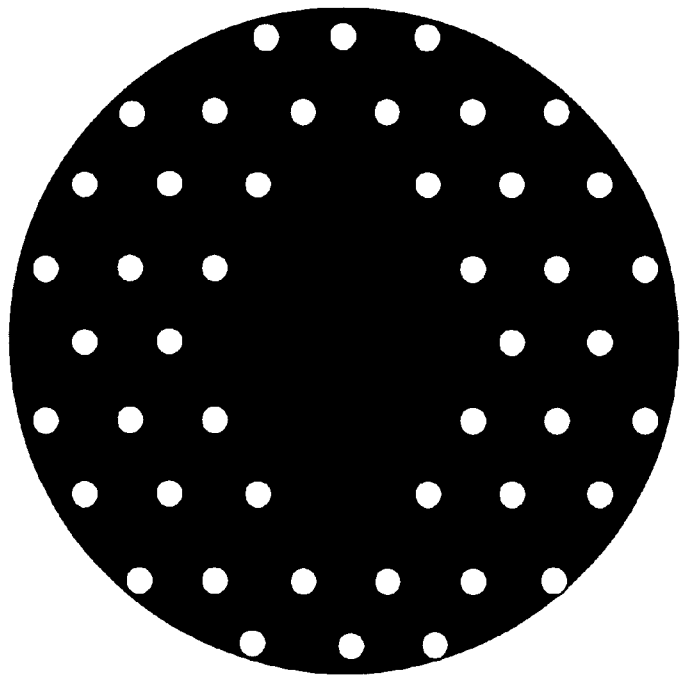

FIG. 12 shows details of a triangular PBG-structure of the preferred embodiment described in relation to FIG. 2B. Here, the light aperture 120 is formed by introducing a defect region in the lattice by removal of nine scattering centres lying adjacently in an elongated region. The light aperture 120 is adapted to provide lasing in modes having a polarisation along the length of the elongated light aperture 120. The outline of the light aperture is preferably rectangular (as in FIG. 2B), trapezoid (as in FIG. 12), or ellipsoidal. However, a perfect geometrical shape is not obtained. Most important, the light aperture affects lasing differently depending on the polarisation of the mode, it suppresses or prevents modes polarised across the elongation, and promotes modes polarised along the elongation. Since the polarisation of any mode can be expressed as a superposition of two perpendicularly polarised modes, one across and one along the elongation, a two fold symmetry of the elongated light aperture is preferred.

Figure 13:
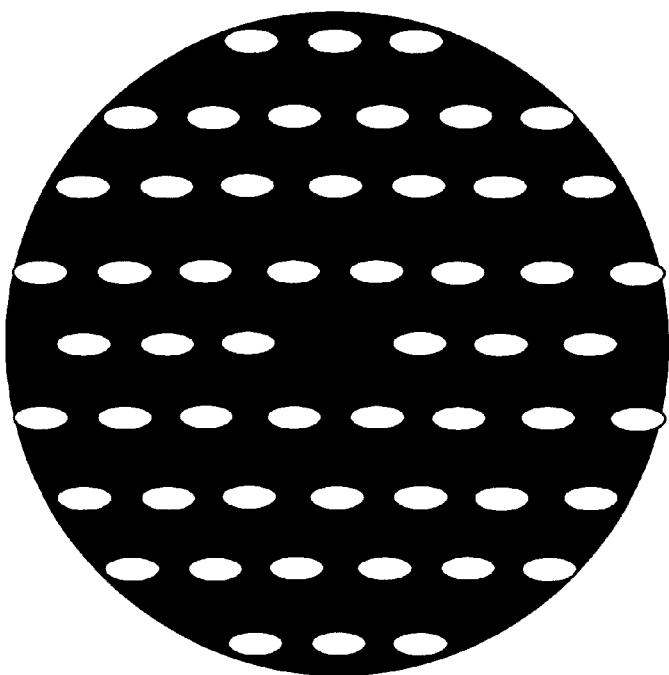

FIG. 13 shows details of a triangular PBG-structure of the preferred embodiment described in relation to FIG. 2C. Here, the scattering centres 117 are elongated along a common direction and the light aperture 118 is formed my introducing a defect region in the lattice by removal of a single scattering centre. As described previously, the elongated scattering centres 117 introduce a symmetry-braking in the PBG structure and thereby in the effects of the PBG structure. The dimensions of the elongated scattering centres 117 could be 1 nm–500 nm along the short axis and 50 nm–1000 nm along the long axis.

Figure 14:
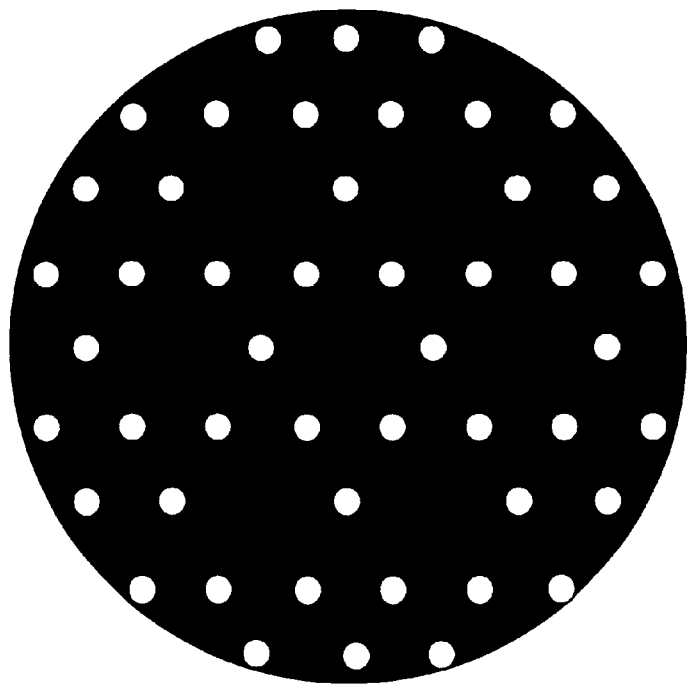

FIG. 14 shows details of a triangular PBG structure of the preferred embodiment described in relation to FIGS. 2D and 7. Here, seven light apertures 118 are formed by introducing seven defect regions in the lattice by removal of seven scattering centres lying separately in a pattern. Each of the light apertures 118 is adapted to provide lasing in only the fundamental mode $TEM_{00}$, and hence forms an array of light apertures similar to the ones described in relation to FIGS. 1A, 1B, 2A, and 6. The position and sizes of the light apertures may be varied to produce a desired far field.

As long at the size of the current aperture or the focus of a pumping laser is large enough to provide a gain region in the overlap between the mode and the active layer, it is the size of the light aperture which controls the size of the lasing modes. If the gain region becomes too small, it will restrict the size of the lasing modes. Thus, the relative sizes between the gain region and the light aperture should be adjusted so that the size of the gain region does not restrict the lasing modes, as this is the task of the light aperture. Typically, the light aperture has a diameter between 2 μm and 50 μm. However, depending on the design of the rest of the VCSEL structure, diameters outside this interval may be used.

Since the PBG affects the transverse components of the modes, the desired angle of emission of laser light from the VCSEL (light aperture) is an important feature to consider in the designing of the lattice period Λ of the PBG structure. Light emitted in a direction, $k_n$, normal to the mirrors does not have any transverse components and hence is not affected by the PBG. Light emitted in a direction $k_\theta$ forming an angle θ to $k_n$, has a transverse component of: $k_n$ sin θ.

The appropriate distance Λ between the holes in the microstructured areas can be calculated from the formula:

$$\sin(\theta)\frac{2\pi}{\lambda} = \frac{2\pi}{\Lambda} \cdot \frac{1}{f(A)},$$

where θ is the angle of the emitted light, λ is the wavelength of the light in air and f(A) is a form factor depending on the PBG microstructuring and on the filling fraction of high-index to low index material, A. For a one-dimensional Bragg reflector f(A) is 0.25, while for two-dimensional PBG structures it can be higher. For example, with θ=10° and λ=1 μm, the distance Λ can be several times the wavelength, and the PBG microstructuring will suppress modes with external angles larger than 10° for these design parameters.

Application of these PBG structured VCSEL include optical communication as e.g. transmitters for local area networks where single mode operation is desired. In addition, applications in the area of optical storage are possible with the extended range of single mode power obtained in these PBG VCSELS. Furthermore, applications in the area of optical pumping of e.g. rare earth doped optical fibres or waveguides should be possible with the improved far field properties of the PBG VCSEL.

Figure 6B:
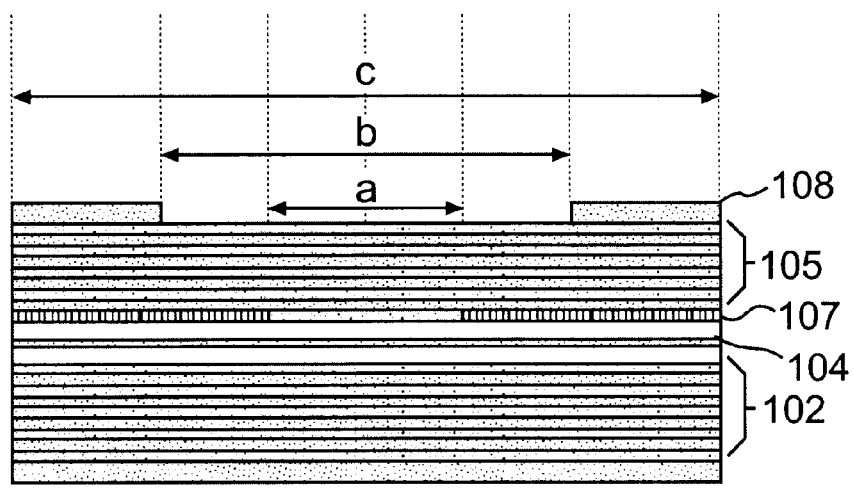
Figure 15A:
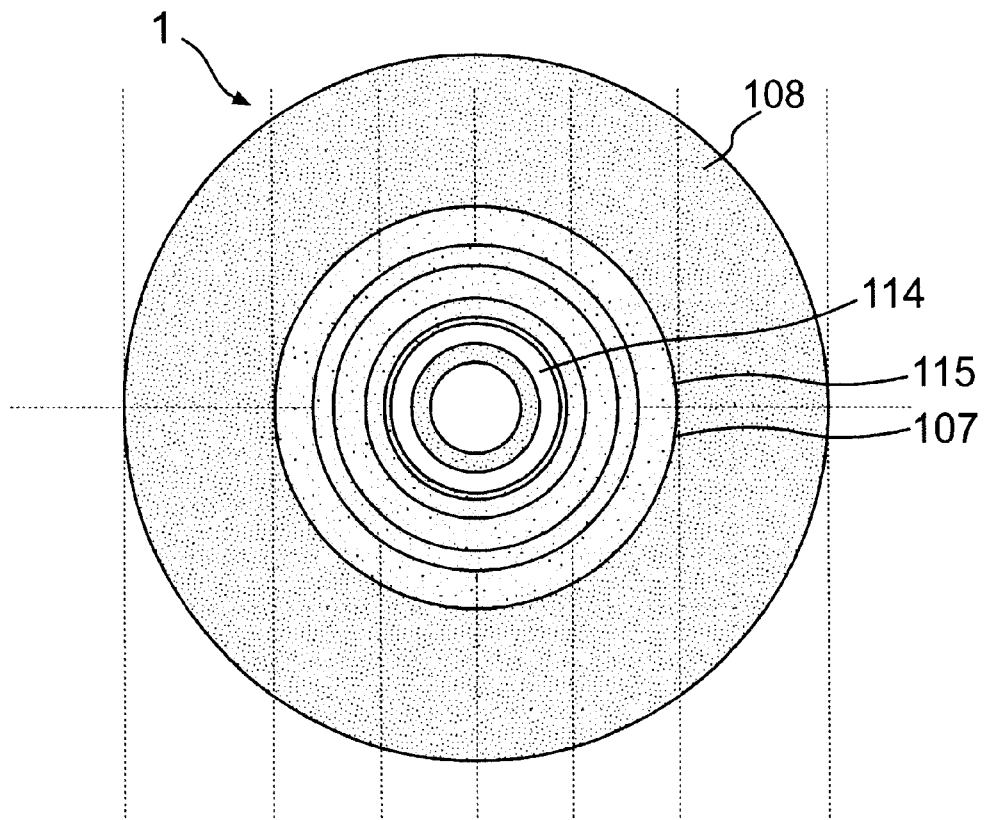
Figure 15B:
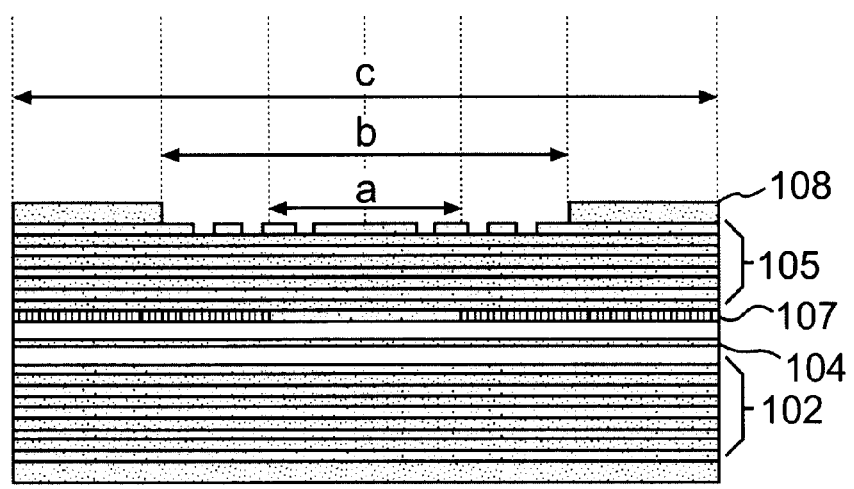

FIGS. 15A and 15B show an alternative embodiment of the present invention as compared to FIGS. 6A and 6B. In this embodiment, the PBG micro structuring 115 is realised in the radial direction and hence forming concentric circles as illustrated in FIG. 15A. The PBG structure is then primarily a one-dimensional periodic or quasi-periodic structure. An aperture 118 in the centre of the circles defines the optical mode of the lasing action and the concentric index modulation prevents higher order modes from reaching lasing condition. FIG. 15A shows in top view the concentric circles 115 indicating the lateral index modulation and the light aperture 118 in the centre. The side view of FIG. 15B shows one embodiment of the lateral one-dimensional index modulation, here, by etching circular trenches in the top mirror 105. Other embodiments are as discussed for the realisation of two-dimensional PBG array.

When the PBG micro structuring 115 has a circular symmetrical shape as described above, the circles are preferably not arranged periodically. Rather, a pitch is introduced in the mutual distance between neighbouring circles. In a preferred embodiment the pitch may be described by a Bessel function.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A vertical cavity surface emitting laser comprising
a semiconductor material layer having a gain region adapted to generate light and to emit the generated light,
first and second at least substantially parallel mirrors forming a laser cavity comprising the gain region and at least one spacer layer being positioned between the gain region and the first and/or the second mirror, at least the first mirror being partially transparent to the generated light so as to allow the light generated in the gain region to be emitted through the first mirror, the laser cavity and the gain region supporting at least one transverse electromagnetic mode for the generated light, and
a lattice region having a two-dimensional periodic lattice of scattering centers, formed within or adjacent to the first and/or the second mirror, or within one of the at least one spacer layer(s), the periodic lattice being positioned parallel to the first and second mirror, the periodic lattice having a periodicity which substantially prevents the generated light from propagating in said lattice region, the lattice region further defining a light aperture without said periodicity, so as to allow the generated light to propagate through said light aperture, the dimensions of the lattice region and the light aperture being adapted to at least partly control an efficiency of laser action in each transverse electromagnetic mode, the dimension of the lattice region in a direction normal to the first and second mirror being significantly smaller than the overall dimension of the vertical cavity surface emitting laser in said direction.

2. A vertical cavity surface emitting laser according to claim 1, wherein the lattice region is positioned in such a way that it does not intersect the gain region.

3. A vertical cavity surface emitting laser according to claim 1, wherein the laser cavity and the gain region support a plurality of transverse modes for the generated light, and wherein each transverse electromagnetic mode can be defined by a distribution of wave-vectors k having transverse components $k_T$ in the lattice region, and wherein the dimensions of the lattice region and the light aperture controls the laser action for each transverse electromagnetic mode by controlling a ratio between transverse components $k_T$ lying within the light aperture and transverse components $k_T$ lying within the lattice region.

4. A vertical cavity surface emitting laser according to claim 3, wherein the ratio between transverse components $k_T$ lying within the light aperture and transverse components $k_T$ lying within the lattice region determines a suppression or prevention of laser action in transverse electromagnetic modes so as to suppress or prevent laser action in modes having a low ratio in relation to modes having a high ratio.

5. A vertical cavity surface emitting laser according to claim 1, wherein the dimensions of the lattice region and the light aperture are adapted to deteriorate laser action in higher order transverse electromagnetic modes in relation to laser action in a fundamental transverse electromagnetic mode of the cavity ($TEM_{00}$).

6. A vertical cavity surface emitting laser according to claim 1, further comprising current supply means for supplying an electric current to a predetermined region of the semiconductor material, said predetermined region defining the gain region, said predetermined region being characterized in that it, in a plane at least substantially parallel to the first and second mirror, has a substantial overlap with two or more transverse electromagnetic modes of the cavity.

7. A vertical cavity surface emitting laser according to claim 1, further comprising optical pumping means for supplying optical pumping to a predetermined region of the semiconductor material, said predetermined region defining the gain region, said predetermined region being characterized in that it, in a plane at least substantially parallel to the first and second mirror, has a substantial overlap with two or more transverse electromagnetic modes of the cavity.

8. A vertical cavity surface emitting laser according to claim 1, wherein the first and second parallel mirrors are distributed Bragg reflectors.

9. A vertical cavity surface emitting laser according to claim 1, wherein the light aperture has a three or more fold symmetry.

10. A vertical cavity surface emitting laser comprising
a semiconductor material body having a gain region adapted to generate light and to emit the generated light,
first and second parallel mirrors forming a laser cavity comprising the gain region and at least one spacer layer being positioned between the gain region and the first and/or the second mirror, at least the first mirror being partially transparent to the generated light so as to allow the light generated in the gain region to be emitted through the first mirror, the laser cavity and the gain region supporting at least one transverse electromagnetic mode for the generated light, and
a lattice region having a two-dimensional periodic lattice of scattering centers, formed within or adjacent to the first and/or the second mirror, or within one of the at least one spacer layer(s), the periodic lattice being positioned in parallel with the first and second mirror, the periodic lattice having a periodicity which substantially prevents the generated light from propagating in said lattice region, the lattice region further defining an elongated light aperture without said periodicity, said elongated aperture having a dimension $\alpha$ along a first axis and a dimension $\beta<\alpha$ along a second axis perpendicular to the first axis, the dimensions of the lattice region and the elongated light aperture being adapted to at least partly control an efficiency of laser action in each transverse electromagnetic mode and to suppress or prevent laser action in transverse electric modes which are not polarised at least substantially parallel to the first axis, the dimension of the lattice region in a direction normal to the first and second mirror being significantly smaller than the overall dimension of the vertical cavity surface emitting laser in said direction.

11. A vertical cavity surface emitting laser according to claim 10, wherein the lattice region is positioned in such a way that it does not intersect the gain region.

12. A vertical cavity surface emitting laser according to claim 10, wherein the elongated light aperture has a two fold symmetry.

13. A vertical cavity surface emitting laser comprising
a semiconductor material body having a gain region adapted to generate light and to emit the generated light,
first and second parallel mirrors forming a laser cavity comprising the gain region and at least one spacer layer being positioned between the gain region and the first and/or the second mirror, at least the first mirror being partially transparent to the generated light so as to allow the light generated in the gain region to be emitted through the first mirror, the laser cavity and the gain region supporting at least one transverse electromagnetic mode for the generated light, and
a lattice region having a two-dimensional periodic lattice of scattering centers, formed within or adjacent to the first and/or the second mirror, or within one of the at least one spacer layer(s), the periodic lattice being positioned in parallel with the first and second mirror, the periodic lattice having a periodicity which substantially prevents the generated light from propagating in said lattice region, the scattering centers being elongated along a first axis, the lattice region further defining a light aperture without said periodicity, the dimensions of the lattice region and the light aperture being adapted to at least partly control an efficiency of laser action in each transverse electromagnetic mode and the elongation of the scattering centers being adapted to suppress or prevent laser action in transverse electric modes which is not polarised at least substantially parallel to the first axis.

14. A vertical cavity surface emitting laser according to claim 13, wherein the dimension of the lattice region in a direction normal to the first and second mirror is significantly smaller than the overall dimension of the vertical cavity surface emitting laser in said direction.

15. A vertical cavity surface emitting laser according to claim 13, wherein the lattice region is positioned in such a way that it does not intersect the gain region.

16. A vertical cavity surface emitting laser according to claim 13, wherein the light aperture has a three or more fold symmetry.

17. A phased array of vertical cavity surface emitting lasers comprising
a semiconductor material body having a gain region adapted to generate light and to emit the generated light,
first and second parallel mirrors forming a laser cavity comprising the gain region and at least one spacer layer being positioned between the gain region and the first and/or the second mirror, at least the first mirror being partially transparent to the generated light so as to allow the light generated in the gain region to be emitted through the first mirror, and a lattice region having a two-dimensional periodic lattice of scattering centers, formed within or adjacent to the first and/or the second mirror, or within one of the at least one spacer layer(s), the periodic lattice being positioned in parallel with the first and second mirror, the periodic lattice having a periodicity which substantially prevents the generated light from propagating in said lattice region, the lattice region further defining two or more separated light apertures positioned within a part of the lattice region defined by a normal projection of the gain region onto the lattice region, the two or more light apertures being regions without said periodicity forming two or more coupled laser resonators, the dimensions of the lattice region and the two or more light apertures being adapted to at least partly control an efficiency of laser action in transverse electromagnetic modes in each laser resonator.

18. A phased array of vertical cavity surface emitting lasers according to claim 17, wherein the dimension of the lattice region in a direction normal to the first and second mirror is significantly smaller than the overall dimension of the phased array of vertical cavity surface emitting lasers in said direction.

19. A phased array of vertical cavity surface emitting lasers according to claim 17, wherein the lattice region is positioned in such a way that it does not intersect the gain region.

20. A phased array of vertical cavity surface emitting lasers according to claim 17, wherein the dimensions and positions of the light apertures are adapted to focus the emitted light at a distance from the laser.

21. A method of manufacturing a vertical cavity surface emitting laser with control of transverse electromagnetic mode, the method comprising the steps of:

providing a substrate, forming a first parallel stack of distributed Bragg reflectors on the substrate, forming an active layer and a spacer layer on the first parallel stack, forming a second parallel stack of distributed Bragg reflectors on the active layer and the spacer layer, forming a lattice region having a two-dimensional periodic lattice of scattering centers, the lattice region being formed within or adjacent to the first and/or the second parallel stack, or within the spacer layer, by forming a periodic modulation in the permittivity of one or more layers of the first and/or the second parallel stack, or the spacer layer, said lattice region defining a light aperture for controlling the transverse electromagnetic mode, said light aperture being formed by a region in the lattice region without said periodic modulation of the permittivity.

22. A method according to claim 21, wherein the lattice region is formed and positioned in such a way that it does not intersect the gain region.

23. A method according to claim 21, wherein said periodic modulation of the permittivity is formed by forming a periodic lattice of holes in the first and/or the second parallel stack.

24. A method according to claim 21, wherein said periodic modulation of the permittivity is formed by depositing metallic pads in a periodic lattice on the second stack.

25. A method according to claim 21, wherein the light aperture has a three or more fold symmetry.

26. A method according to claim 25, wherein the light aperture at least substantially has the shape of a regular polygon.

27. A method according to claim 21, wherein the light aperture has a two fold symmetry and is elongated along a first axis defining a polarisation axis for the modes.

28. A method according to claim 21, further comprising the steps of:

forming a current aperture for defining a gain region in the active layer, and forming charge injection means for providing current to the active layer.

29. A method according to claim 21, wherein the first parallel stack is formed by materials which are at least substantially transparent for radiation of wavelength $\lambda_p$, and wherein the active layer at least substantially absorbs radiation of wavelength $\lambda_p$.

30. A method of manufacturing an array of coupled vertical cavity surface emitting lasers with individual control of transverse electromagnetic modes, the method comprising the method according to claim 21, wherein the step of forming the lattice region comprises the step of forming the lattice region so as to define two or more light apertures.

* * * * *